United States Patent
Narasimha et al.

(10) Patent No.: US 10,034,200 B2
(45) Date of Patent: Jul. 24, 2018

(54) ITERATIVELY TRANSMITTING RANDOM LINEAR NETWORK ENCODED PACKETS FROM MULTIPLE TRANSMISSION NODES

(71) Applicant: Motorola Mobility LLC, Chicago, IL (US)

(72) Inventors: Murali Narasimha, Vernon Hills, IL (US); Hossein Bagheri, Urbana, IL (US)

(73) Assignee: Motorola Mobility LLC, Chicago, IL (US)

( * ) Notice: Subject to any disclaimer, the term of this patent is extended or adjusted under 35 U.S.C. 154(b) by 197 days.

(21) Appl. No.: 15/046,571

(22) Filed: Feb. 18, 2016

(65) Prior Publication Data

US 2017/0118673 A1    Apr. 27, 2017

Related U.S. Application Data

(60) Provisional application No. 62/245,750, filed on Oct. 23, 2015.

(51) Int. Cl.
*H04W 28/06* (2009.01)
*H04L 1/00* (2006.01)
(Continued)

(52) U.S. Cl.
CPC .......... *H04W 28/06* (2013.01); *H03M 13/373* (2013.01); *H03M 13/3761* (2013.01);
(Continued)

(58) Field of Classification Search
CPC .............. H04W 28/06; H03M 13/373; H03M 13/3761; H04L 1/1819; H04L 1/0011;
(Continued)

(56) References Cited

U.S. PATENT DOCUMENTS

| | | | |
|---|---|---|---|
| 7,408,938 B1 * | 8/2008 | Chou | H04H 20/42 370/394 |
| 9,647,800 B2 * | 5/2017 | Lucani | H04L 1/0065 |

(Continued)

FOREIGN PATENT DOCUMENTS

WO    WO-2007113822 A2 *    10/2007    ............ H04W 28/06

OTHER PUBLICATIONS

U. Shevade, Y-C. Chen, L. Qiu, Y. Zhang, V. Chandar, M. Han, H.H.Song, Y. S. Seung, "Enabling High-Bandwidth Vehicular Content Distribution," ACM CoNEXT 2010, Nov. 30-Dec. 3, 2010, Philadelphia, all pages.

(Continued)

*Primary Examiner* — Tejis Daya
(74) *Attorney, Agent, or Firm* — Kunzler, PC

(57) ABSTRACT

For random linear network encoded data transmission, a method communicates a Galois field to user equipment. In addition, the method receives a set of k data packets, wherein at least two of the k packets are of different packet lengths. The method further resizes the k data packets to generate k packets of equal packet length. The method encodes the k resized data packets from a first data ensemble into r random linear network coded (RLNC) packets as a function of the Galois field. The method further iteratively transmits the RLNC packets from two or more transmission nodes to the user equipment until the decode feedback indicates that a packet ensemble is decoded from the transmitted RLNC packets. Each RLNC packet is transmitted by a selected transmission node.

20 Claims, 12 Drawing Sheets

(51) Int. Cl.
    *H03M 13/37*    (2006.01)
    *H04L 1/02*    (2006.01)
    *H04L 1/16*    (2006.01)
    *H04L 1/18*    (2006.01)

(52) U.S. Cl.
    CPC ......... *H04L 1/0011* (2013.01); *H04L 1/0057* (2013.01); *H04L 1/02* (2013.01); *H04L 1/1671* (2013.01); *H04L 1/1819* (2013.01); *H04L 2001/0096* (2013.01); *H04L 2001/0097* (2013.01)

(58) Field of Classification Search
    CPC ....... H04L 1/02; H04L 1/0057; H04L 1/1671; H04L 2001/0097; H04L 2001/0096
    See application file for complete search history.

(56) References Cited

U.S. PATENT DOCUMENTS

| | | | | |
|---|---|---|---|---|
| 9,787,614 | B2* | 10/2017 | Heide | H04L 49/9057 |
| 2010/0017676 | A1* | 1/2010 | Gross | H03M 13/1171 |
| | | | | 714/752 |
| 2012/0054583 | A1* | 3/2012 | Park | H03M 13/3761 |
| | | | | 714/776 |
| 2012/0236763 | A1* | 9/2012 | Lucani | H04L 1/0041 |
| | | | | 370/276 |
| 2013/0195106 | A1* | 8/2013 | Calmon | H04B 7/15521 |
| | | | | 370/389 |
| 2015/0012804 | A1* | 1/2015 | Yu | H04L 1/0057 |
| | | | | 714/784 |
| 2015/0146615 | A1* | 5/2015 | Yu | H04L 5/0032 |
| | | | | 370/328 |
| 2016/0182088 | A1* | 6/2016 | Sipos | G06F 3/064 |
| | | | | 714/764 |
| 2016/0205586 | A1* | 7/2016 | Kim | H04L 1/1607 |
| | | | | 370/230 |
| 2017/0013065 | A1* | 1/2017 | Ho | H04L 43/0829 |
| 2017/0142238 | A1* | 5/2017 | Gligoroski | H04L 69/324 |

OTHER PUBLICATIONS

B. Swapna, A. Eryilmaz, and N. Shroff, "Throughput-Delay Analysis of Random Linear Network Coding for Wireless Broadcasting," IEEE Symposium on Network Coding 2010, Jun. 9-11, 2010, all pages.

D. Nguyen, T. Tran, T. Nguyen, B. Bose, "Wireless Broadcast Using Network Coding," IEEE Transactions on Vehicular Technology, vol. 58, Issue: 2, Feb. 13, 2009, all pages.

* cited by examiner

ITERATIVELY TRANSMITTING RANDOM LINEAR NETWORK ENCODED PACKETS FROM MULTIPLE TRANSMISSION NODES

CROSS-REFERENCES TO RELATED APPLICATIONS

This application claims the benefit of U.S. Provisional Patent Application No. 62/245,750, entitled "Random Linear Network Encoded Data Transmission" and filed on Oct. 23, 2015 for Murali Narasimha, et al., which is incorporated herein by reference.

FIELD

The subject matter disclosed herein relates to random linear network encoded data and more particularly relates to transmitting random linear network encoded data

BACKGROUND

Description of the Related Art
User equipment such as mobile telephones typically communicates with a single base station.

BRIEF SUMMARY

A method for random linear network encoded data transmission is disclosed. The method communicates a Galois field to user equipment. In addition, the method receives a set of k data packets, wherein at least two of the k packets are of different packet lengths. The method further resizes the k data packets to generate k packets of equal packet length. The method encodes the k resized data packets from a first data ensemble into r random linear network coded (RLNC) packets as a function of the Galois field, wherein r≥k and each RLNC packet comprises an encoding vector, RLNC sub-packets, and an ensemble number that identifies the first data ensemble. The method further iteratively transmits the RLNC packets from two or more transmission nodes to the user equipment until the decode feedback indicates that a packet ensemble is decoded from the transmitted RLNC packets. Each RLNC packet is transmitted by a selected transmission node. An apparatus also performs the functions of the method.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
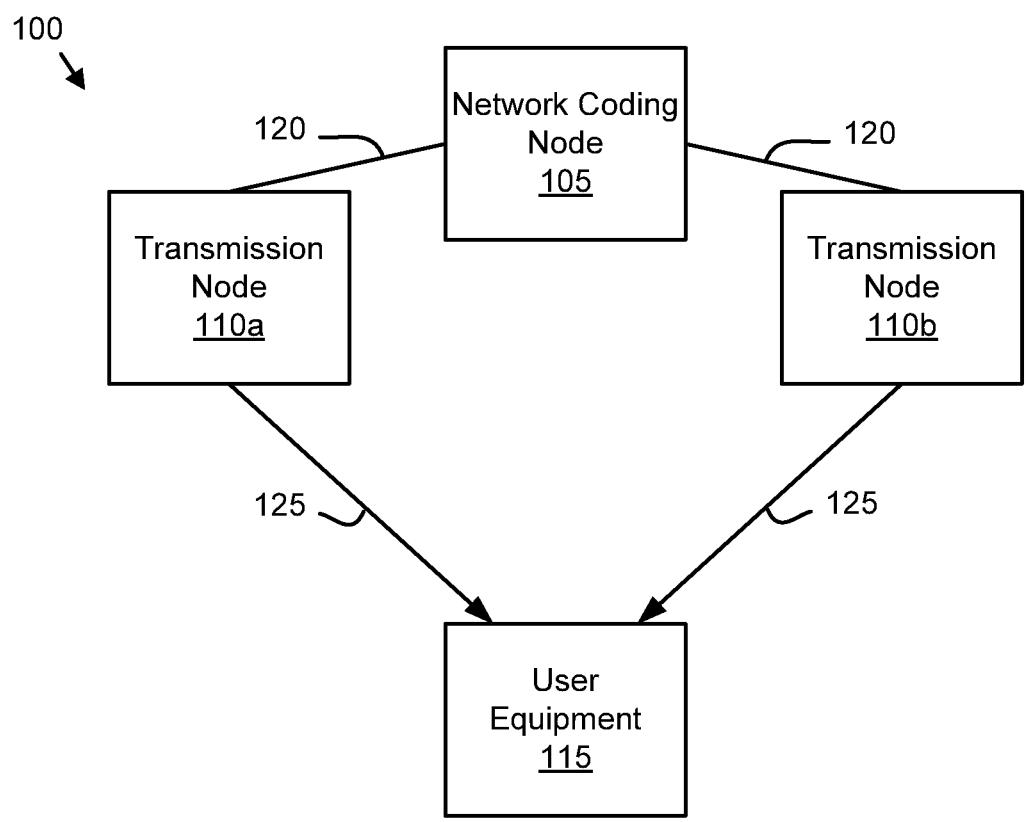
FIG. 1 is a schematic block diagram illustrating one embodiment of a data transmission system.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 is a schematic block diagram illustrating one embodiment of a data transmission system 100. The system 100 may include a network coding node 105, one or more transmission nodes 110, and user equipment 115. In the depicted embodiment, a first transmission node 110a and a second transmission node 110b are shown, but "transmission nodes 110" may refer to any number of transmission nodes 110.

The network coding node 105 may include one or more servers. In a certain embodiment, the network coding node 105 includes a transmitter and/or receiver. The network coding node 105 may communicate with the transmission nodes 110 over a backhaul channel 120. The network coding node 105 may generate protocol data units (PDU) from data packets and communicate the PDU to the transmission nodes 110. The transmission nodes 110 may be evolved node B (eNB) Long Term Evolution (LTE) base stations or access points of a millimeter-wave based Communication System.

The transmission nodes 110 may communicate the PDU to the user equipment 115 over one or more wireless frequencies 125. The user equipment 115 may be a mobile telephone, a tablet computer, a laptop computer, an embedded computing device, or the like.

In the past, the user equipment 115 typically communicated with a single transmission node 110. However, it may be advantageous for the user equipment 115 to concurrently communicate with multiple transmission nodes 110. For example, higher wireless frequencies 125 support higher data transmission rates. However, higher frequencies and higher data transmission rates often reduce the effective range of communication over the wireless frequencies 125. The use of multiple transmission nodes 110 may increase the reliability and efficiency of communications between the transmission nodes 110 and the user equipment 115.

Unfortunately, if the PDU from one transmission node 110 is lost, the PDU must be retransmitted, reducing overall data transmission performance. In addition, if the PDU is delayed, the overall data transmission performance is also reduced.

The embodiments described herein encode data packets as RLNC packets that distribute the data that is communicated from the transmission nodes 110 to the user equipment 115 as will be described hereafter. As a result, data transmission performance is maintained even when PDU are lost and/or delayed when communicated from the transmission nodes 110 to the user equipment 115.

Figure 2A:
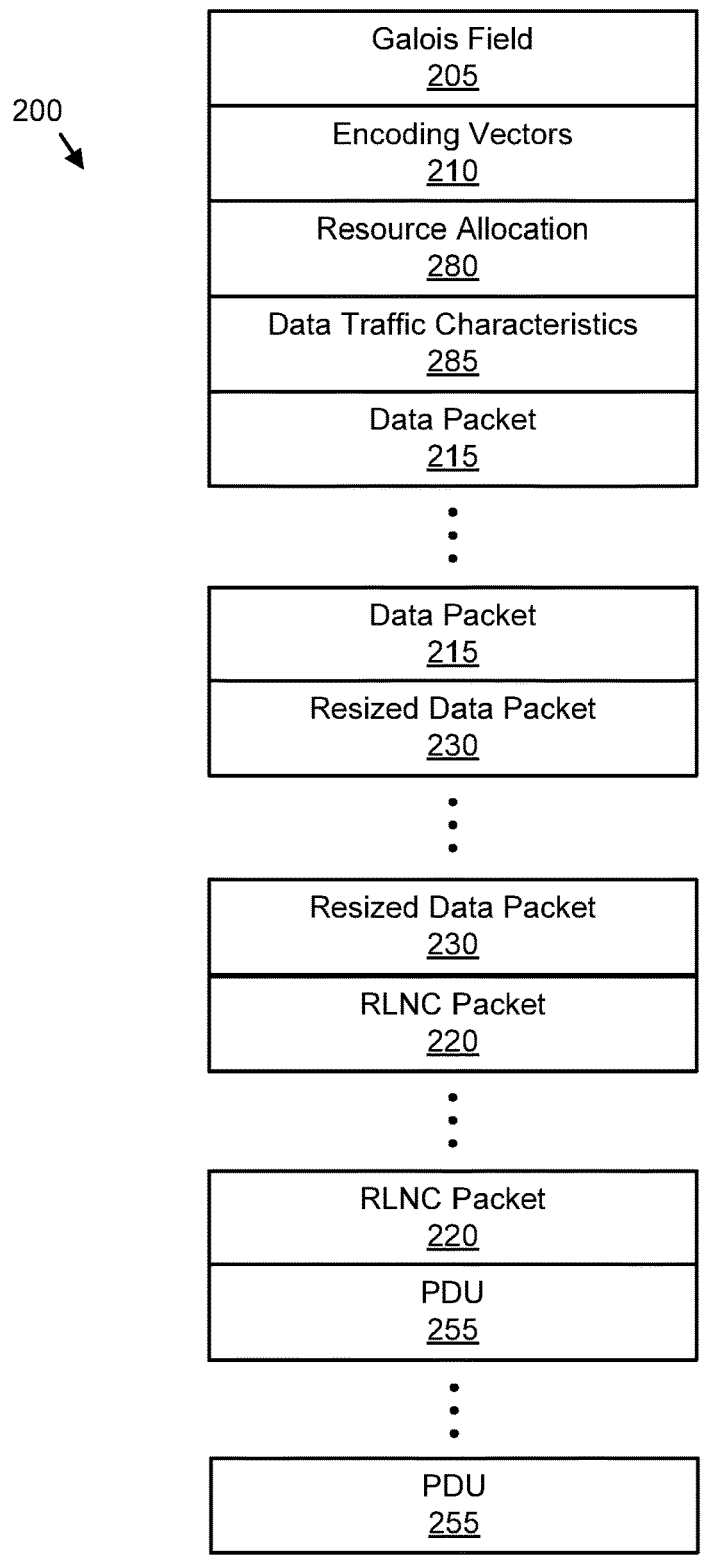
FIG. 2A is a schematic block diagram illustrating one embodiment of encoding data.

FIG. 2A is a schematic block diagram illustrating one embodiment of encoding data 200. The encoding data 200 maybe organized as a data structure in a memory. In the depicted embodiment, the encoding data 200 includes a Galois field 205, encoding vectors 210, a resource allocation 280, data traffic characteristics 285, one or more data packets 215, one or more resized data packets 230, one or more RLNC packets 220, and one or more PDU 255.

The Galois field 205 may store a finite number of numeric values. In one embodiment, the Galois field 205 is generated based on a predetermined size of the Galois field. The resource allocation 280 may indicate available storage on the user equipment 115. The data traffic characteristics 285 may include packet arrival requirements specifying how frequently a PDU may be received by the user equipment 115. In addition, the data traffic characteristics 285 may include delay requirements specifying a delay between PDU received by the user equipment 115.

Each data packet 215 may comprise data that is to be communicated from the network coding node 105 through the transmission nodes 110 to the user equipment 115. In one embodiment, each data packet 215 is a member of a packet ensemble. Each packet ensemble may include a plurality of data packets 215.

The resized data packets 230 are data packets 215 that have been resized. In one embodiment, the resized data packets 230 each have a specified packet length. The resizing of the data packets 215 into resized data packets 230 is described hereafter in FIGS. 3B-C.

The RLNC packets 220 may be generated from the resized data packets 230. In addition, the PDU 255 may each be generated from one or more RLNC packets 220 as will be described hereafter.

Figure 2B:
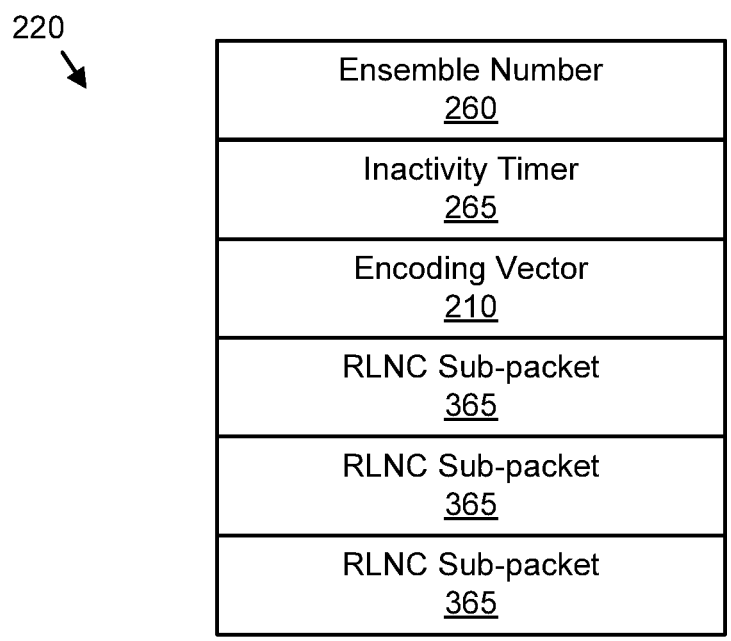
FIG. 2B is a schematic block diagram illustrating one embodiment of an RLNC packet.

FIG. 2B is a schematic block diagram illustrating one embodiment of an RLNC packet 220. The RLNC packet 220 may be organized as a data structure in a memory. In the depicted embodiment, the RLNC packet 220 includes an ensemble number 260, an inactivity timer 265, an encoding vector 210, and one or more RLNC sub-packets 365. The RLNC packet 220 may also include additional elements. The ensemble number 260 and inactivity timer 265 may be included in a header of the RLNC packet 220. In another embodiment, the inactivity timer 265 may not be included in the data structure of the RLNC packet 220 and may instead be a part of a separate data structure.

The ensemble number 260 identifies a packet ensemble of data packets 215 that are used to generate the RLNC packet 220. In one embodiment, each data packet 215 of a first packet ensemble shares the same ensemble number 260.

The inactivity timer 265 may specify a time interval for which the user equipment 115 will continue to receive the RLNC packets 220. In one embodiment, the inactivity timer 265 is reduced in response to decode feedback that the user equipment 115 decoded a packet ensemble. Alternatively, the current inactivity timer 265 may be smaller than initial inactivity timer value in response to decode feedback that the user equipment 115 decoded the packet ensemble. In one embodiment the inactivity timer 265 may be communicated to a transmission node 110 with the RLNC packet 220. In another embodiment, the inactivity timer 265 may be configured independently using other signaling mechanisms between the network coding node 105 and the user equipment 115.

The encoding vector 210 may be randomly selected from the Galois field 205. Each RLNC packet 365 may comprise data from data packets 215 encoded as a function of the encoding vector 210 as will be described hereafter.

Figure 3A:
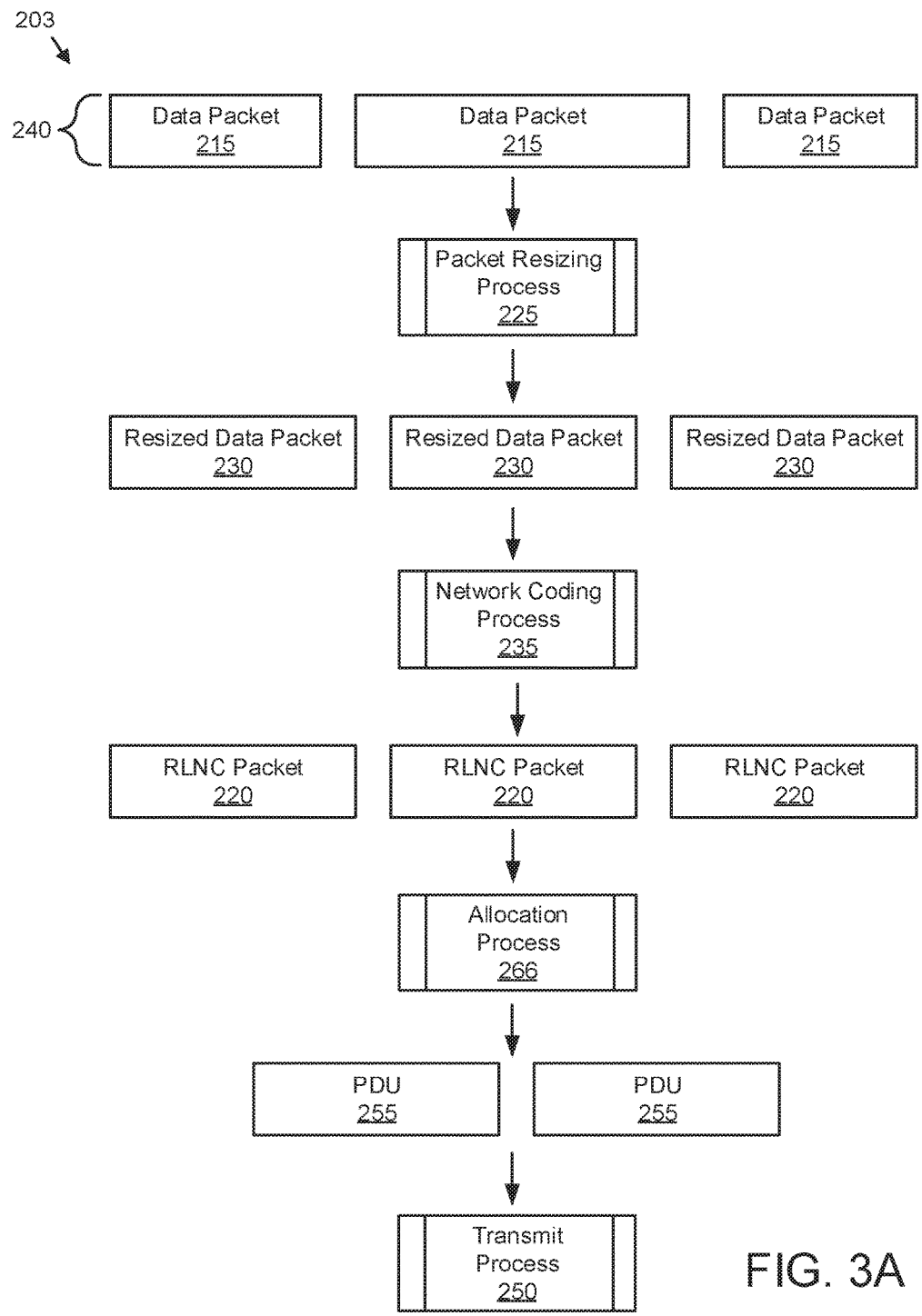
FIG. 3A is a schematic block diagram illustrating one embodiment of an RLNC encoding process.

FIG. 3A is a schematic block diagram illustrating one embodiment of a RLNC encoding process 203. The process 203 may encode the data packets 215 as RLNC packets 220 and allocate the RLNC packets 220 to one or more PDU 255. In the depicted embodiment, a packet ensemble 240 comprises data packets 215 of varying packet lengths. The packet resizing process 225 resizes the data packets 215 of the packet ensemble 240 as resized data packets 230. Each resized data packet 230 is a specified packet length.

An allocation process 266 generates PDU 255 from the one or more RLNC packets 220. A transmission process 250 may transmit the PDU 255 from the transmission nodes 110.

An allocation process 265 generates PDU 255 from the one or more RLNC packets 220. A transmission process 250 may transmit the PDU 255 from the transmission nodes 110.

Figure 3B:
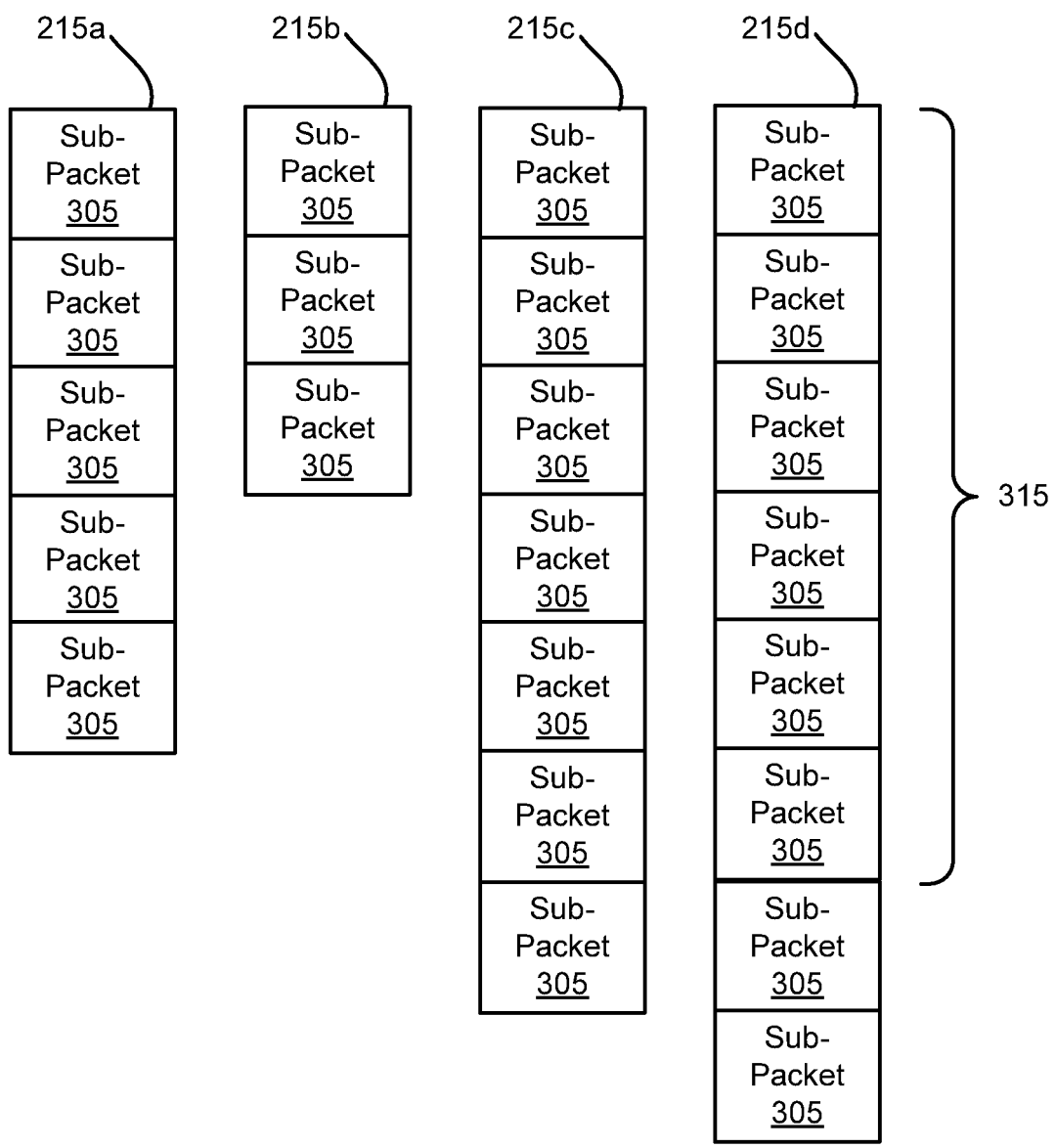
FIG. 3B is a schematic block diagram illustrating one embodiment of data packets with sub-packets.

FIG. 3B is a schematic block diagram illustrating one embodiment of data packets with sub-packets 305. A plurality of data packets 215 is shown. Each data packet 215 includes one or more sub-packets 305. In addition, the data packets 215 may be of different packet lengths. In the depicted embodiment, the data packets 215 are of different packet lengths because the data packets 215 comprise different numbers of sub-packets 305. Alternatively, the data packets 215 may include the same number of sub-packets 305. The data packets 215 may be included in a packet ensemble 240.

The packet resizing process 225 may resize the data packets 215 so that each data packet 215 has a specified packet length l 315. In one embodiment, the specified packet length l 315 is greater than or equal to a total number of sub-packets 305 in the plurality of data packets 215 divided by a value k. The determination of k is described hereafter.

Figure 3C:
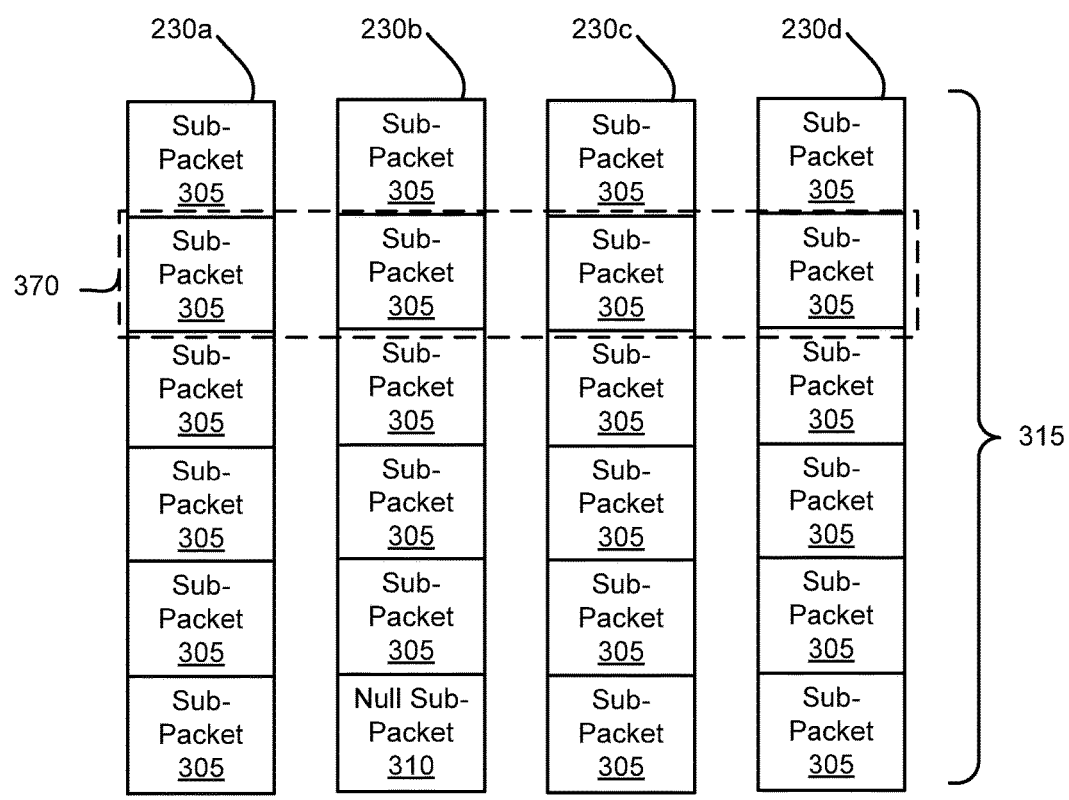
FIG. 3C is a schematic block diagram illustrating one embodiment of resized data packets.

FIG. 3C is a schematic block diagram illustrating one embodiment of resized data packets 230. In the depicted embodiment, the packet resizing process 225 resizes the data packets 215 of FIG. 3B to the specified packet length l 315. In one embodiment, sub-packets 305 from long data packets 215 with greater than l 315 sub-packets 305 are distributed to short data packets 215 with less than l 315 sub-packets 305. In a certain embodiment, one or more null sub-packets 310 may be appended to short data packets 215 with less than l 315 sub-packets 305.

In one embodiment, one or more sub-packets 305 may be encoded to form an RLNC sub-packet 365. In the depicted embodiment, an RLNC sub-packet 365 may be generated by encoding a row 370 of sub-packets 305.

Figure 3D:
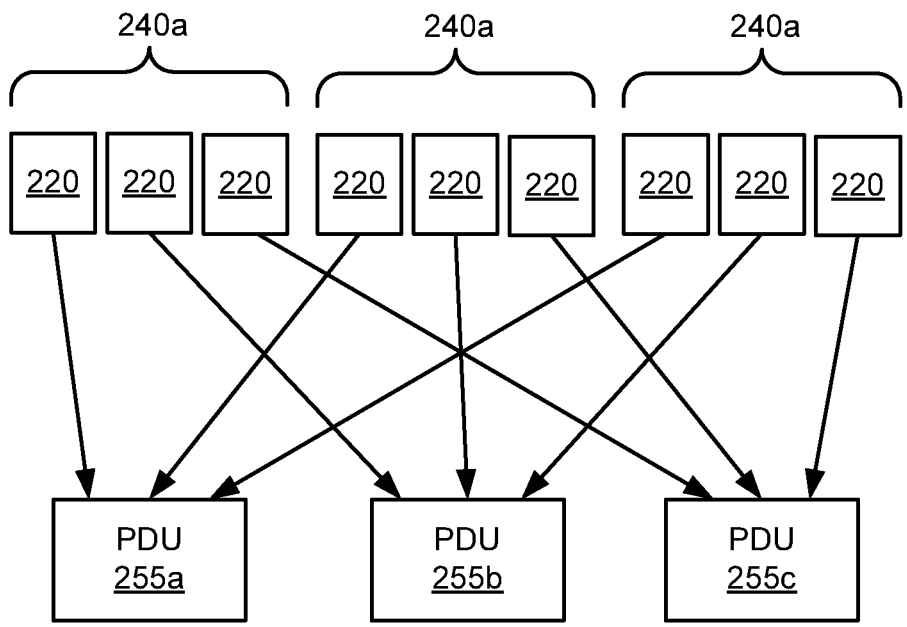
FIG. 3D is a schematic block diagram illustrating one embodiment of an allocation process.

FIG. 3D is a schematic block diagram illustrating one embodiment of the allocation process 266. In the depicted embodiment, a plurality of packet ensembles 240 is allocated to a plurality of PDU 255. In one embodiment, each PDU 255 is filled with one RLNC packet 220 from each packet ensemble 240 of a plurality of packet ensembles 240. Alternatively, each PDU 255 is filled with one RLNC sub-packet 365 from each packet ensemble 240 of the plurality of packet ensemble 240.

Figure 3E:
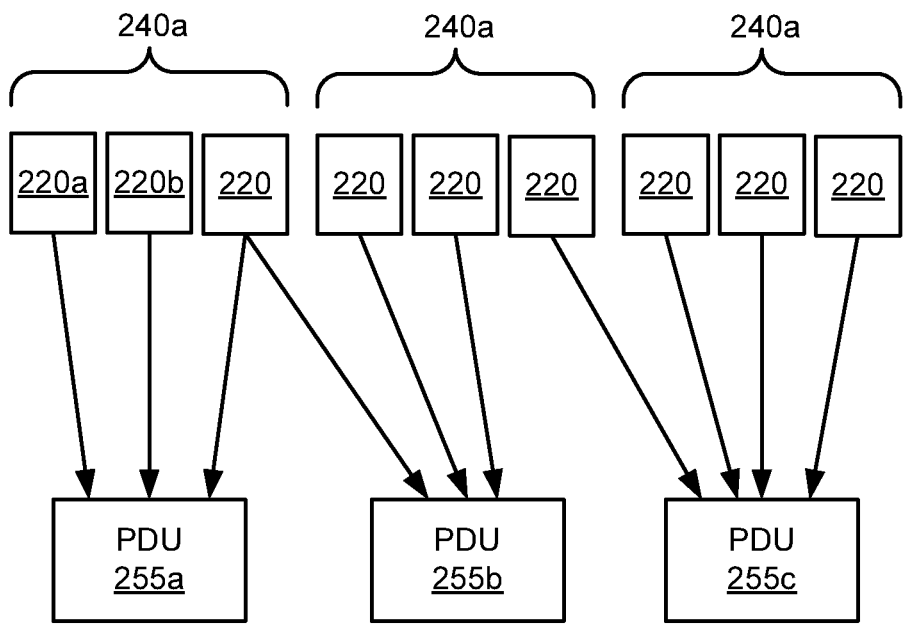
FIG. 3E is a schematic block diagram illustrating one alternate embodiment of an allocation process.

FIG. 3E is a schematic block diagram illustrating one alternate embodiment of the allocation process 266. In the depicted embodiment, a PDU 255 is initially filled with RLNC sub-packets 365 from the first RLNC packet 220a and subsequently filled with RLNC sub-packets 365 from the second RLNC packet 220b.

Figure 3F:
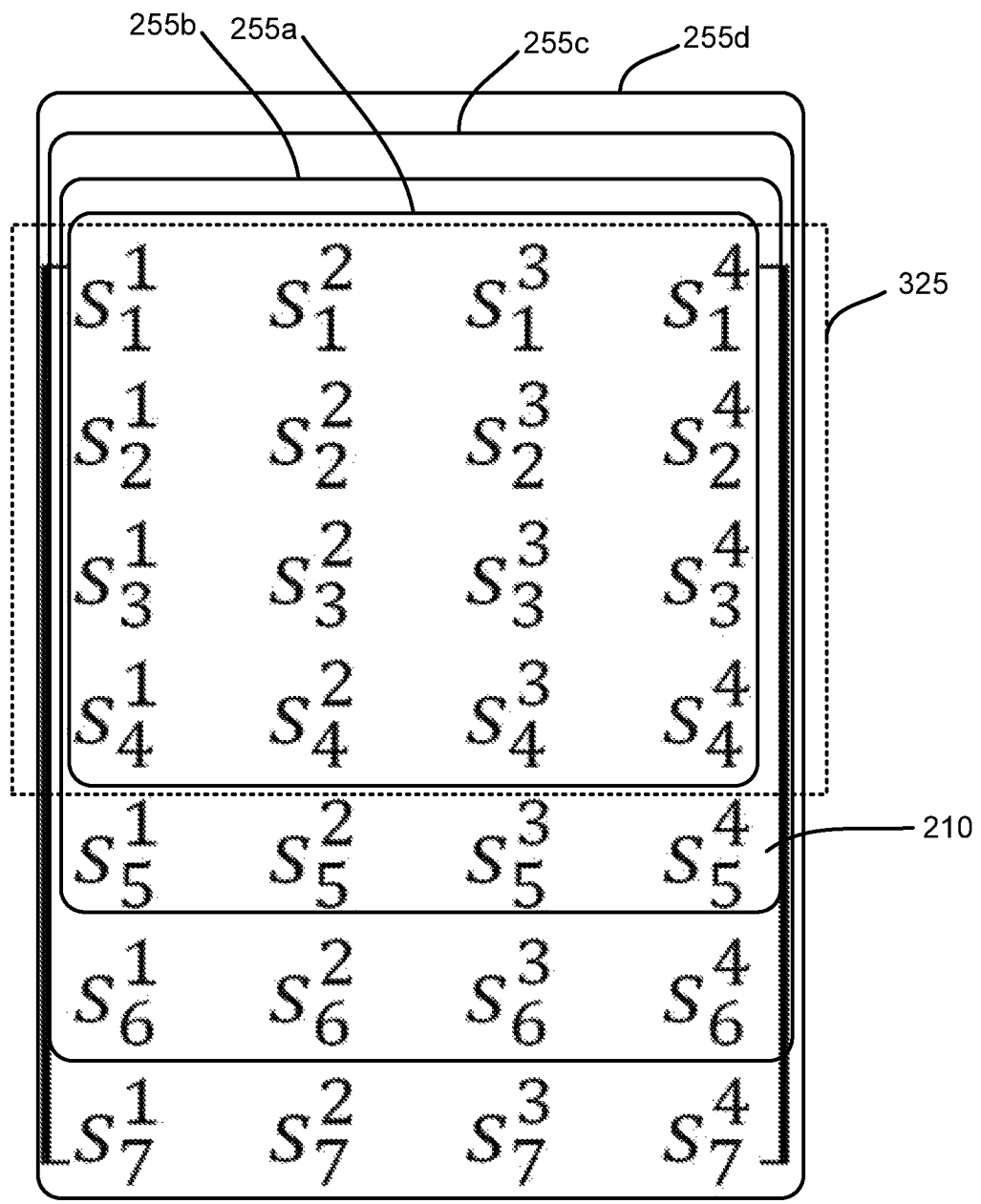
FIG. 3F is a drawing illustrating determining which data can be acknowledged as having been decoded.

FIG. 3F is a drawing illustrating determining which data can be acknowledged as being decodable. The depicted embodiment corresponds to a k of 4, with PDU 255 constructed for 4 RLNC packets 220 generated from one packet ensemble 240 of data packets 215. Each RLNC packet 220 comprises RLNC sub-packets 365. $s_j^i$ refers to the j-th sub-packet 305 of the i-th data packet 215. RLNC sub-packets 365 are generated by encoding rows of sub-packets 305. For example, encoding of sub-packets 305 $s_1^1, s_1^2, s_1^3, s_1^4$ yields an RLNC sub-packet 365. Similarly, encoding of sub-packets 305 $s_3^1, s_3^2, s_3^3, s_3^4$ yields another RLNC sub-packet 365. In the depicted embodiment, a first PDU 255a comprises RLNC sub-packets 365 $r_1^1, r_2^1, r_3^1, r_4^1$, wherein each $r_j^1$ is obtained by encoding the j-th row. The second PDU 255b comprises RLNC sub-packets 365 $r_1^2, r_2^2, r_3^2, r_4^2, r_5^2$, wherein each $r_j^2$ is obtained by encoding the j-th row. The third PDU 255c comprises RLNC sub-packets 365 $r_1^3, r_2^3, r_3^3, r_4^3, r_5^3, r_6^3$, wherein $r_j^3$ is obtained by encoding the j-th row. The fourth PDU 255d comprises RLNC sub-packets 365 $r_1^4, r_2^4, r_3^4, r_4^4, r_5^4, r_6^4, r_7^4$, wherein $r_j^4$ is obtained by encoding the j-th row.

Upon receiving the fourth PDU 255d, the user equipment 115 may determine that the user equipment 105 has received adequate RLNC sub-packets 365 to enable decoding of sub-packets 305 $s_1^1 \ldots s_4^4, s_1^2 \ldots s_4^2, s_1^3 \ldots s_4^3$ and $s_1^4 \ldots s_4^4$. The user equipment 115 can further determine that the user equipment 115 has not received adequate RLNC sub-packets 365 to enable decoding of certain sub-packets 305, for example, $s_5^1, s_5^2, s_5^3$ and $s_5^4$. The user equipment 115 may send an acknowledgement indicating that $s_1^1 \ldots s_4^4, s_1^2 \ldots s_4^2, s_1^3 \ldots s_4^3$ and $s_1^4 \ldots s_4^4$ can be decoded. In particular, $s_1^1, s_1^2, s_1^3, s_1^4$ can be decoded because four linear combinations of $s_1^1, s_1^2, s_1^3, s_1^4$ have been received; $s_2^1, s_2^2, s_2^3, s_2^4$ can be decoded because four linear combinations of $s_2^1, s_2^2, s_2^3, s_2^4$ have been received; $s_3^1, s_3^2, s_3^3, s_3^4$ can be decoded because four linear combinations of $s_3^1, s_3^2, s_3^3, s_3^4$ have been received; and $s_4^1, s_4^2, s_4^3, s_4^4$ can be decoded because four linear combinations of $s_4^1, s_4^2, s_4^3, s_4^4$ have been received. In subsequent PDUs 255, the network coding node 105 need not send RLNC sub-packets 365 generated from the first four rows 325 in response to receiving the acknowledgement.

In one embodiment, when a PDU 255 is received by the user equipment 115, the RLNC sub-packets 365 of the PDU 255 may be considered decoded by the network coding node 105. The user equipment 115 may communicate the receipt of the PDU 255 to the network coding node 105 using decode feedback. The user equipment 115 may communicate the decode feedback before the user equipment 115 has decoded the RLNC sub-packets 365. For example, if decode feedback is communicated from the user equipment 115 indicating that the second PDU 255b, the third PDU 255c and the fourth PDU 244d where received, the RLNC sub-packets 365 within area 325 may be considered decoded by the network coding node 105.

Figure 3G:
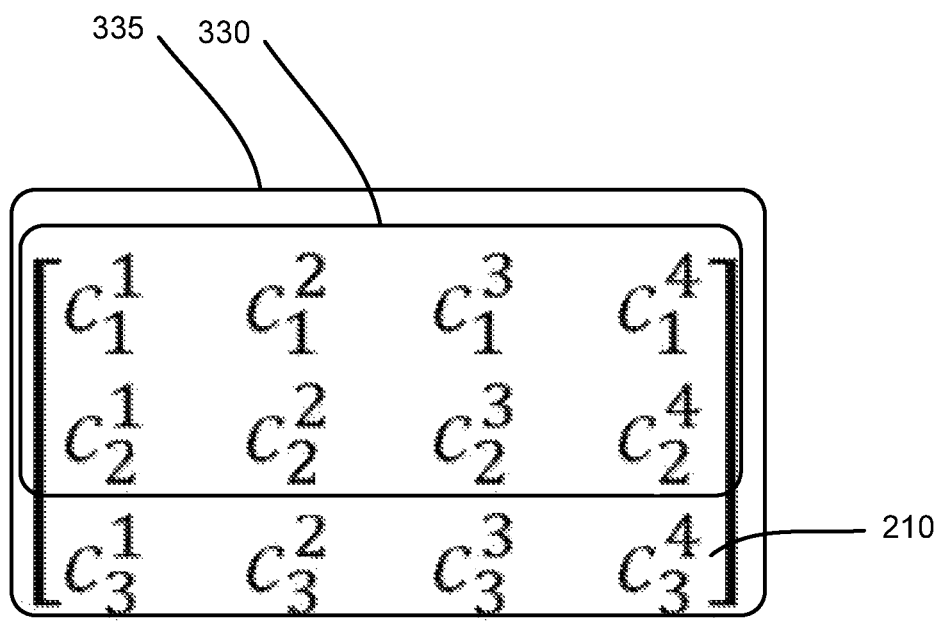
FIG. 3G is a drawing illustrating one embodiment of augmenting a transfer matrix.

FIG. 3G is a drawing illustrating one embodiment of augmenting a transfer matrix 330. An initial transfer matrix 330 may include coefficients c for encoding vectors 210. A test matrix 335 may be constructed from the initial transfer matrix 330 with an encoding vector 210 added to the transfer matrix 330. The incremental encoding vector 210 may augment the transfer matrix 330 if the test matrix 335 has a higher rank than the transfer matrix, such as is depicted. The encoding vector 210 may augment the transfer matrix 330 if the encoding vector 210 is linearly independent of the rows of the transfer matrix 330.

Figure 4:
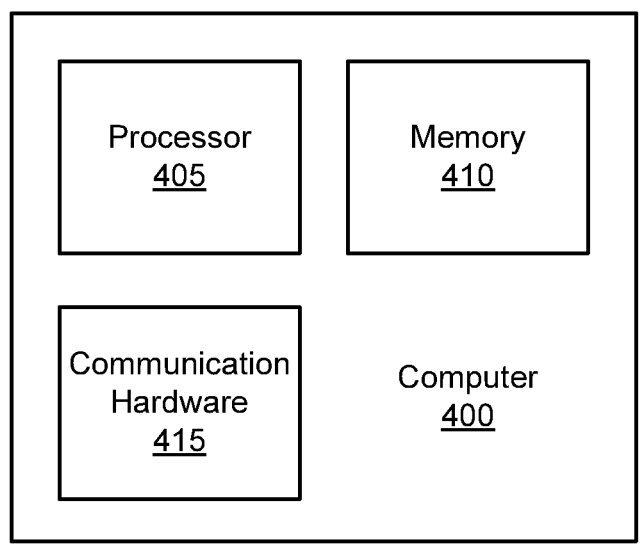
FIG. 4 is a schematic block diagram illustrating one embodiment of a computer.

FIG. 4 is a schematic block diagram illustrating one embodiment of a computer 400. The computer 400 may be embodied in one or more of the network coding node 105, the transmission nodes 110, and/or the user equipment 115. In the depicted embodiment, the computer 400 includes a processor 405, a memory 410, and communication hardware 415. The memory 410 may include a semiconductor storage device, a hard disk drive, an optical storage device, a micromechanical storage device, or combinations thereof. The memory 410 may store code. The processor 405 may execute the code. The communication hardware 415 may communicate with other devices.

Figure 5A:
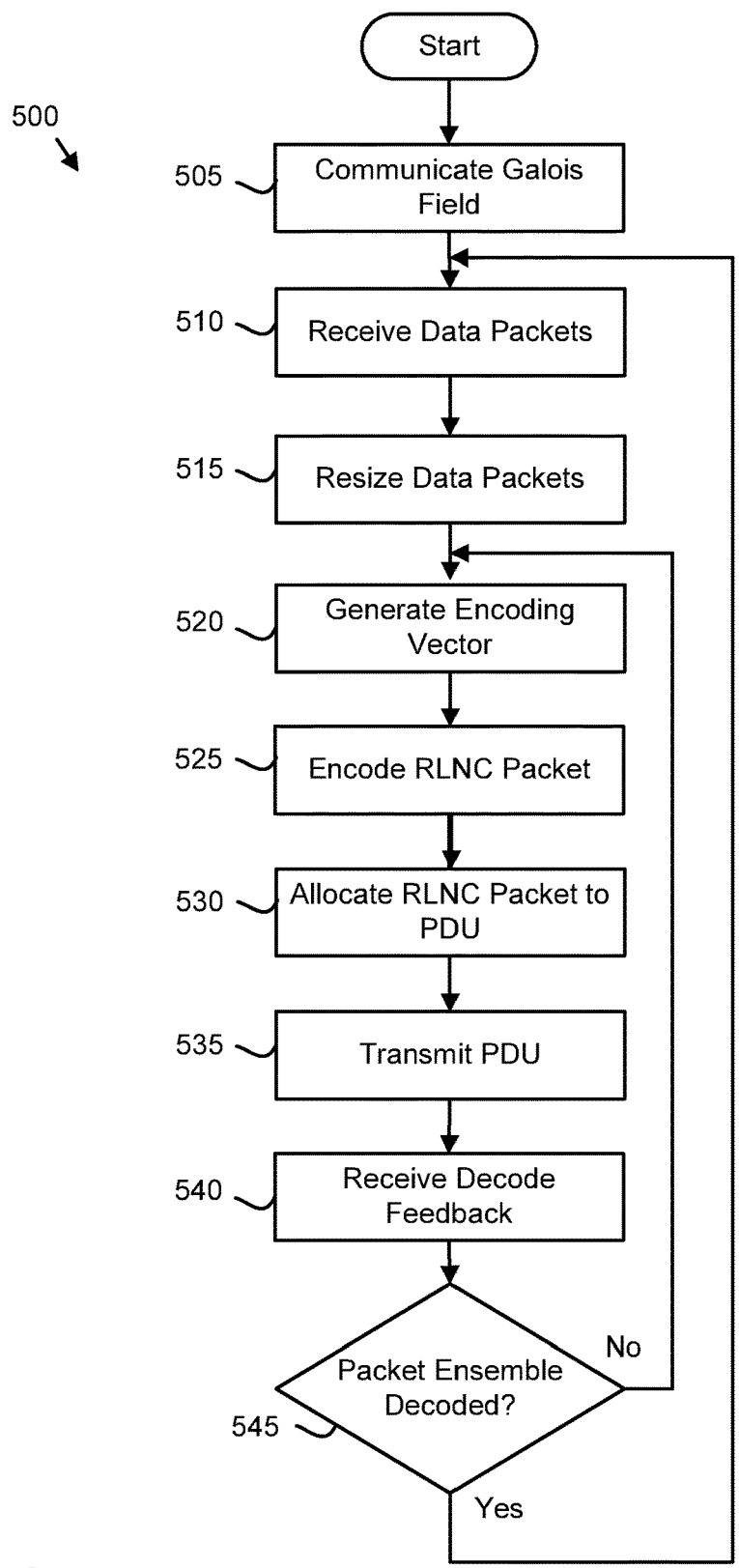
FIG. 5A is a schematic flow chart diagram illustrating one embodiment of an RLNC packet transmission method.

FIG. 5A is a schematic flow chart diagram illustrating one embodiment of an RLNC packet transmission method 500. The method 500 may generate an RNLC packet 220 as part of a PDU 255 at the network coding node 105 and transmit the PDU 255 through the transmission nodes 110 to the user equipment 115. The method 500 may be performed by the processor 405 of the network coding node 105 and/or transmission nodes 110.

The method 500 starts, and in one embodiment, the processor 405 communicates 505 the Galois field 205 from the network coding node 105 through the transmission nodes 110 to the user equipment 115. The processor 405 may generate the Galois field 205. Alternatively the Galois field 205 may be retrieved from a file.

The processor 405 receives 510 the data packets 215. The data packets 215 maybe organized as a packet ensemble 240. In one embodiment, the processor 405 resizes 515 the data packets 215. The processor may resize 515 the data packets 215 by calculating the specified packet length l 315, distributing sub-packets 305 from long data packets 215 with greater than l sub-packets 305 to short data packets 215 with less than l sub-packets 305, and appending null sub-packets 310 to short data packets 215 with less than l sub-packets 305 as illustrated in FIG. 3C.

The processor 405 may generate 520 the encoding vector 210. In a certain embodiment, the processor 405 generates the encoding vector 210 as comprising k encoding coefficients $[c_1^i, c_2^i, \ldots c_k^i]$ by randomly selecting elements from the Galois field 205. Each coefficient c is a member of the Galois field 205.

In one embodiment, the processor 405 encodes 525 k resized data packets 230 from a first data ensemble 240 into r RLNC packets 220 as a function of the Galois field 205. The value k may be an integer and may be calculated as a function of a resource allocation 280 and data traffic characteristics 285. The value k may be selected such that the RLNC packets 220 and/or PDU 255 do not exceed a buffer space of the user equipment 115. In one embodiment, r≥k. For example, at least one data packet 215 may be encoded with two or more encoding vectors 210 into two or more RLNC packets 220 and the two or more RLNC packets 220 communicated to the user equipment 115. As a result, some RLNC packets 220 may be redundant. In addition, some RLNC packets 220 may include redundant RLNC sub-packets 365.

The processor 405 may encode 525 the plurality of k data packets $p_1, \ldots, p_k$ 215 as the plurality of r RLNC packets 220. Each RLNC packet R 220 may be calculated as shown in Equation 1, where i is an index number, $p_i$ is a data packet 215, and $[c_1, c_2, \ldots, c_k]$ is the encoding vector.

$$R = \Sigma_{i=1}^k c_i p_i \qquad \text{Equation 1}$$

The data packets $p_1, \ldots, p_k$ 215 may each have l sub-packets. Consequently, Equation 1 yields an RLNC packet R 220 which has l RLNC sub-packets $r_1, r_2, \ldots, r_l$ 365. More specifically, the j-th RLNC sub-packet $r_j$ 365 can be obtained as shown in the following equation, where i is an index number, $[c_1, c_2, \ldots, c_k]$ is the encoding vector 210, and $s_1^j, s_2^j, \ldots, s_k^j$ are the j-th sub-packets 305 of $p_1, \ldots, p_k$ respectively as shown in Equation 2.

$$r_j = \Sigma_{i=1}^k c_i s_i^j \qquad \text{Equation 2}$$

The processor 405 may allocate 530 a plurality of RLNC packets 220 to a plurality of PDU 255. The RLNC sub-packets 365 of the RLNC packets 220 may be allocated to the PDU 255 at a physical layer of a communication stack. Each PDU 255 may be filled with one RLNC packet 220 from each data ensemble of a plurality data ensemble 240 and/or one RLNC sub-packet 365 from each data ensemble 240 of a plurality data ensemble 240 as illustrated in FIG. 3D. Alternatively, each PDU 255 is initially filled with RLNC sub-packets 365 from the first RLNC packet 220a and subsequently filled with RLNC sub-packets 365 from the second RLNC packet 220b as illustrated in FIG. 3E.

In one embodiment, the processor 405 transmits 535 the PDU 255 with the RLNC packet 220. The PDU 255 and/or RLNC packet 220 may be transmitted 535 by a selected transmission node 110. In one embodiment, the PDU 255 and/or RLNC packet 220 is transmitted 535 by a randomly selected transmission node 110. The processor 405 may iteratively transmit 535 the RLNC packets 220 allocated to the PDU 255.

In a certain embodiment, the processor 405 transmits 535 the PDU 255 and/or RLNC packets 220 from two or more transmission nodes 110 to the user equipment 115. In one embodiment, the transmission 535 of the PDU 255 and/or RLNC packets 220 is regulated such that the PDU 255 and/or RLNC packets 220 do not exceed a buffer space of the user equipment 115.

The processor 405 may transmit 535 the PDU 255 and/or RLNC packets 220 until the processor determines 545 that decode feedback indicates that a packet ensemble 240 is decoded from the transmitted RLNC packets 220. In one embodiment, the processor 405 receives 540 the decode feedback from the user equipment 115. The decode feedback may be selected from the group consisting of an indication that a packet ensemble 240 can be decoded (referred to as an RLNC ACK), an acknowledgement of a receipt of an RLNC packet 220 that may be referred to as a packet ACK, an indication of additional RLNC packets 220 required to decode the packet ensemble 240, an indication of a number of RLNC packets 240 received, a negative acknowledgement of not receiving the one of the RLNC packets 220 that may be referred to as a packet NACK, and a negative acknowledgement indicating that the user equipment 110 does not have sufficient RLNC packets 220 to decode the packet ensemble 240. The packet ACK and the packet NACK may be signaling at the physical layer. For example, the packet ACK may be a Hybrid ARQ acknowledgement and the packet NACK may be a Hybrid ARQ negative acknowledgement. The decode feedback may include the ensemble number 260.

The decode feedback may indicate available memory space for user equipment 115. In one embodiment, the decode feedback includes a retransmission request indicating that the first RLNC packet 220 is not received. The retransmission request may be referred to as HARQ-NACK. The first RLNC packet 220 may be retransmitted 535 in response to the retransmission request.

The processor 405 may determine 545 if the transmitted packet ensemble 240 is decoded. The packet ensemble 240 may be decoded if the decode feedback from the user equipment 115 includes an indication that all sub-packets 305 of the packet ensemble 240 have been received by the user equipment 115. Alternatively, the packet ensemble 240 may be considered decoded if the decode feedback from the user equipment 115 includes an indication that the packet ensemble 240 can be decoded.

If the transmitted packet ensemble 240 is not considered decoded the processor 405 may iteratively generate 520 another encoding vector 210 and encode 525 another RLNC packet 220 for the packet ensemble 240, allocate 530 the encoded RLNC packet 220 to another PDU 255, and transmit 535 the PDU 255. If the processor 405 determines 545 that the packet ensemble 240 is decoded, the processor 405 may receive 510 additional data packets 215 in a next packet ensemble 240.

Figure 5B:
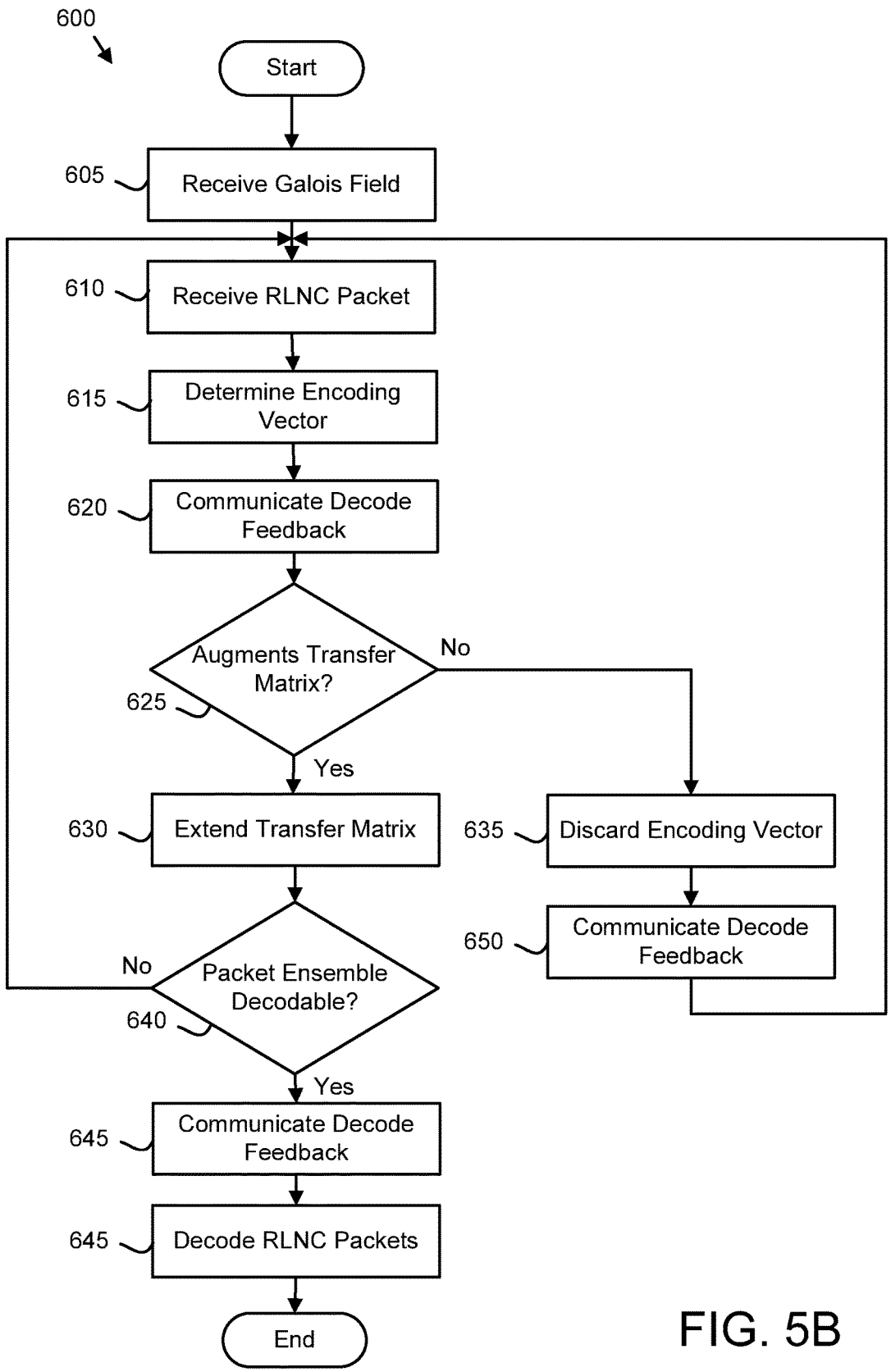
FIG. 5B is a schematic flowchart diagram illustrating one embodiment of an RLNC packet decoding method.

FIG. 5B is a schematic flowchart diagram illustrating one embodiment of an RLNC packet decoding method 600. The method 600 may decode the RLNC packet 220 and/or PDU 255 at the user equipment 115. The method 600 may be performed by the processor 405 of the user equipment 115.

The method 600 starts, and in one embodiment, the processor 405 receives 605 the Galois field 205 from the network coding node 105. The processor 405 may further receive 610 the PDU 255 and/or RLNC packet 220 from the transmission nodes 110.

The processor 405 may determine 615 the encoding vector 210 from the RLNC packet 220. The encoding vector 210 may be extracted from the RLNC packet 220. If a transfer matrix 330 has not been created, the processor 405 creates a transfer matrix 330 consisting of a single row. The single row may be set to the extracted encoding vector 210.

In one embodiment, the processor 405 communicates 620 decode feedback to the network coding node 105. The decode feedback may include the ensemble number 260. In a certain embodiment, the decode feedback includes an acknowledgment of receipt of the RLNC packet 220 and/or PDU 255.

The processor 405 may determine 625 if one or more extracted incremental encoding vectors 210 augments the transfer matrix 330. The incremental encoding vectors 210 may augment the transfer matrix 330 if the test matrix 335 comprising the transfer matrix 330 with the incremental encoding vector 210 added to the transfer matrix 330 as an additional row of the transfer matrix 330 has a higher rank than the transfer matrix 330.

If the incremental encoding vector 210 does not augment the transfer matrix 330, the processor 405 may discard 635 the incremental encoding vector 210. In addition, the processor 405 may communicate 650 decode feedback with an indication that additional RLNC packets 220 are required to decode the packet ensemble 240, a negative acknowledgment indicating that the user equipment 115 does not have sufficient RLNC packets 220 to decode the packet ensemble 240, or combinations thereof. The processor 405 may further receive 610 a next RLNC packet 220 and/or PDU 255.

If the incremental encoding vector 210 does augment the transfer matrix 330, the processor 405 may extend 630 the transfer matrix 330 with the incremental encoding vector 210 by adding the incremental encoding vector 210 as a row of the transfer matrix 330. The processor 405 may further determine 640 if the packet ensemble 240 can be decoded. For example, the processor 405 may determine 640 that the packet ensemble 240 can be decoded if the n original data packets 215 can be decoded from the k RNLC packets 220.

If the packet ensemble 240 cannot be decoded, the processor 405 may continue to receive 610 RLNC packets 220 and/or PDU 255 and communicate 620 decode feedback with an indication of additional RLNC packets 220 required to decode the packet ensemble 240 from the n original data packets, an indication of the number of RLNC packets 220 received, a negative acknowledgment indicating that the user equipment 115 does not have sufficient RLNC packets 220 to decode the packet ensemble 240, or combinations thereof.

If the packet ensemble 240 can be decoded, the processor 405 may communicate 645 decode feedback that indicates that the packet ensemble 240 can be decoded from the received k RLNC packets 220. The processor 405 may decode 645 the RLNC packets 220 and the method 600 ends. The processor 405 may calculate a coefficient matrix M comprising k encoding vectors $[c_1^i, c_2^i, \ldots c_k^i]$ 210 of coefficients c. The coefficients may be randomly selected from the Galois field 205. The processor 405 may decode 645 the plurality of k RLNC packets $r_i$ 365 using Equation 3, where $p_i$ are the data packets 215 and/or resized data packets 230, and $M^{-1}$ is an inverse of the coefficient matrix M.

$$[p_1, p_2 \ldots p_k] = M^{-1} \cdot [r_1, r_2, \ldots r_k]^T \qquad \text{Equation 3}$$

The embodiments iteratively encode data packets 215 of a packet ensemble 240 into RLNC packets 220 and transmit the RLNC packets 220 allocated to one or more PDU 255 from two or more transmission nodes 110 to the user equipment 115. Redundant RLNC packets 220 and/or PDU 255 may be transmitted. The user equipment 115 may extend the transfer matrix 330 with encoding vectors 210 from received RLNC packets 220 until the packet ensemble 240 may be decoded. Because the embodiments may continue to extend the transfer matrix 330 even if a PDU 255 is lost or if the RLNC packet 220 is not recovered, a decrease in transmission performance is mitigated. In addition, the reliability of the transmission is increased. As a result, higher wireless frequencies 125 and transmission rates may be employed with high reliability. In addition, two or more transmission nodes 110 may reliably communicate with the user equipment 115.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
  communicating, by use of a processor, a Galois field to user equipment;
  receiving a set of k data packets, wherein at least two of the k packets are of different packet lengths;
  resizing the k data packets to generate k packets of equal packet length;
  encoding the k resized data packets from a first data ensemble into r random linear network coded (RLNC) packets as a function of the Galois field, wherein r≥k and each RLNC packet comprises an encoding vector, RLNC sub-packets, and an ensemble number that identifies the first data ensemble;
  receiving a decode feedback from the user equipment; and
  iteratively transmitting the RLNC packets from two or more transmission nodes to the user equipment until the decode feedback indicates that a packet ensemble is decoded from the transmitted RLNC packets, wherein each RLNC packet is transmitted by a selected transmission nodes; and
  determining a user equipment inactivity timer value for which the user equipment will continue to receive the RLNC packets, wherein the inactivity timer value is reduced in response to decode feedback that the user equipment decoded the packet ensemble from the transmitted the RLNC packets.

2. The method of claim 1, wherein the decode feedback is further selected from the group consisting of an indication that the packet ensemble is decoded, an acknowledgement of a receipt of a first RLNC packet, an indication of additional RLNC packets required to decode the packet ensemble, an indication of a number of RLNC packets received, a negative acknowledgement of not receiving one of the RLNC packets, and a negative acknowledgement indicating that the user equipment does not have sufficient RLNC packets to decode the packet ensemble.

3. The method of claim 1, wherein the decode feedback is a retransmission request indicating that a first RLNC packet is not received and wherein the first RLNC packet is retransmitted in response to the retransmission request.

4. The method of claim 1, wherein encoding the plurality of k data packets comprises:
   calculating a coefficient vector comprising k encoding vectors $[c_1^i, c_2^i, \ldots c_k^i]$ of coefficients randomly selected from the Galois field; and
   encoding the plurality of k data packets $p_1, \ldots, p_k$ as the plurality of r RLNC packets wherein each RLNC packet $r_i$ is calculated as $r_i = \sum_{i=1}^{k} c_i p_i$.

5. The method of claim 1, wherein the plurality of data packets are resized by:
   calculating a specified packet length l, wherein l is greater than or equal to a total number of sub-packets in the plurality of data packets divided by k;
   distributing sub-packets from long data packets with greater than l sub-packets to short data packets with less than l sub-packets; and
   appending sub packets to short data packets with less than l sub-packets.

6. The method of claim 1, wherein the inactivity timer value is communicated to a transmission node.

7. The method of claim 1, the method further comprising determining the user equipment inactivity timer value for which the user equipment will continue to receive the RLNC packets, wherein the inactivity timer value is smaller than an initial inactivity timer value in response to decode feedback that the user equipment decoded the packet ensemble.

8. The method of claim 1, the method further comprising calculating k as a function of a resource allocation and data traffic characteristics comprising one or more of packet arrival requirements and delay requirements.

9. The method of claim 8, wherein k is an integer and is selected such that the RLNC packets do not exceed a buffer space of the user equipment and wherein the transmitting of the RLNC packets is regulated such that the RLNC packets do not exceed the buffer space of the user equipment.

10. A method comprising:
    receiving, by use of a processor, k random linear network coded (RLNC) packets, wherein each of the k RLNC packets is constructed from n original data packets;
    recovering k encoding vectors corresponding to the k RLNC packets;
    determining if then original data packets can be decoded from the k RNLC packets;
    communicating, a decode feedback that indicates that a packet ensemble is decoded from the received k RLNC packets and reduces a user equipment inactivity timer value for which user equipment will continue to receive the RLNC packets if the n original data packets can be decoded; and
    communicating, if the n original data packets cannot be decoded, a decode feedback that indicates a number of RLNC packets required for decoding the packet ensemble from the n original data packets.

11. The method of claim 10, wherein an incremental encoding vector augments a transfer matrix if a test matrix has a higher rank than the transfer matrix, wherein the transfer matrix includes coefficients for encoding vectors and the test matrix comprises the transfer matrix with the encoding vector added to the transfer matrix as an additional row of the transfer matrix.

12. The method of claim 10, the method further comprising:
    receiving a Galois field;
    calculating a coefficient matrix M comprising k encoding vectors $[c_1^i, c_2^i, \ldots c_k^i]$ of coefficients c randomly selected from the Galois field, wherein the coefficient matrix has an inverse matrix $M^{-1}$; and
    decoding the plurality of k RLNC packets as $M^{-1} \cdot [r_1, r_2, \ldots r_k]^T$.

13. The method of claim 10, wherein the decode feedback comprises available memory space for user equipment.

14. An apparatus comprising:
    a processor performing:
    communicating a Galois field to user equipment;
    receiving a set of k data packets, wherein at least two of the k packets are of different lengths;
    resizing the k data packets to generate k packets of equal length;
    encoding the k resized data packets from a first data ensemble into r random linear network coded (RLNC) packets as a function of the Galois field, wherein r≥k and each RLNC packet comprises an encoding vector, RLNC sub-packets, and an ensemble number that identifies the first data ensemble;
    receiving a decode feedback from the user equipment;
    iteratively transmitting the RLNC packets from two or more transmission nodes to the user equipment until the decode feedback indicates that a packet ensemble is decoded from the transmitted RLNC packets, wherein each RLNC packet is transmitted by a selected transmission node; and
    determining a user equipment inactivity timer value for which the user equipment will continue to receive the RLNC packets, wherein the inactivity timer value is reduced in response to decode feedback that the user equipment decoded the packet ensemble from the transmitted the RLNC packets.

15. The apparatus of claim 1, wherein the decode feedback is further selected from the group consisting of an indication that the packet ensemble is decoded, an acknowledgement of a receipt of a first RLNC packet, an indication of additional RLNC packets required to decode the packet ensemble, an indication of a number of RLNC packets received, a negative acknowledgement of not receiving one of the RLNC packets, and a negative acknowledgement indicating that the user equipment does not have sufficient RLNC packets to decode the packet ensemble.

16. The apparatus of claim 15, wherein the decode feedback is a retransmission request indicating that a first RLNC packet is not received and wherein the first RLNC packet is retransmitted in response to the retransmission request.

17. The apparatus of claim 15, wherein encoding the plurality of k data packets comprises:
    calculating a coefficient vector comprising k encoding vectors $[c_1^i, c_2^i, \ldots c_k^i]$ of coefficients randomly selected from the Galois field; and
    encoding the plurality of k data packets $p_1, \ldots, p_k$ as the plurality of r RLNC packets wherein each RLNC packet $r_i$ is calculated as $r_i = \sum_{i=1}^{k} c_i p_i$.

18. An apparatus comprising:
    a processor performing:
    receiving, by use of a processor, k random linear network coded (RLNC) packets, wherein each of the k RLNC packets is constructed from n original data packets;
    recovering k encoding vectors corresponding to the k RLNC packets;

determining if then original data packets can be decoded from the k RNLC packets;

communicating, a decode feedback that indicates that a packet ensemble is decoded from the received k RLNC packets and reduces a user equipment inactivity timer value for which user equipment will continue to receive the RLNC packets if the n original data packets can be decoded; and communicating, if the n original data packets cannot be decoded, a decode feedback that indicates a number of RLNC packets required for decoding the packet ensemble from the n original data packets.

19. The apparatus of claim 18, wherein an incremental encoding vector augments a transfer matrix if a test matrix has a higher rank than the transfer matrix, wherein the transfer matrix includes coefficients for encoding vectors and the test matrix comprises the transfer matrix with the encoding vector added to the transfer matrix as an additional row of the transfer matrix.

20. The apparatus of claim 18, the processor further performing:

receiving a Galois field;

calculating a coefficient matrix M comprising k encoding vectors $[c_1^i, c_2^i, \ldots c_k^i]$ of coefficients c randomly selected from the Galois field, wherein the coefficient matrix has an inverse matrix $M^{-1}$; and decoding the plurality of k RLNC packets as $M^{-1} \cdot [r_1, r_2, \ldots r_k]^T$.

* * * * *